United States Patent [19]
Earl

[11] Patent Number: 6,040,719
[45] Date of Patent: Mar. 21, 2000

[54] INPUT RECEIVER FOR LIMITING CURRENT DURING RELIABILITY SCREENING

[75] Inventor: Jeffrey S. Earl, San Jose, Calif.

[73] Assignee: Vanguard International Semiconductor Corporation, Hsinchu, Taiwan

[21] Appl. No.: 09/044,205

[22] Filed: Mar. 17, 1998

[51] Int. Cl.[7] ..................................................... H03K 5/22
[52] U.S. Cl. ............................. 327/78; 327/77; 375/317; 375/318
[58] Field of Search .................................. 327/77, 78, 89, 327/108, 427, 434; 375/316, 317, 318, 346

[56] References Cited

U.S. PATENT DOCUMENTS

| | | | |
|---|---|---|---|
| 5,512,852 | 4/1996 | Kowalski | 327/77 |
| 5,557,221 | 9/1996 | Taguchi et al. | 327/77 |
| 5,689,199 | 11/1997 | Erckert | 327/77 |

*Primary Examiner*—Jung Ho Kim
*Attorney, Agent, or Firm*—Christensen O'Connor Johnson & Kindness PLLC

[57] ABSTRACT

The present invention provides an input receiver that slows the signal fluctuation by limiting the amount of electrical currents flowing through the input receiver. The limiting of electrical current flowing through the input receiver slows the input signal of the receiver which in effect filters out some level of glitches of an input signal. In one embodiment, the input receiver is constructed and implemented in a structure similar to a differential amplifier for a single interface. In another embodiment, the input receiver is constructed and implemented in a modified differential amplifier for a single interface. In a further embodiment, the input receiver is constructed and implemented in a modified differential amplifier for multiple interfaces.

24 Claims, 4 Drawing Sheets

INPUT RECEIVER FOR LIMITING CURRENT DURING RELIABILITY SCREENING

FIELD OF THE INVENTION

The present invention relates generally to the manufacturing of integrated circuits, and more particularly, to reliability screening of high speed input receivers.

BACKGROUND OF THE INVENTION

Input receivers, like any semiconductor devices, undergo testing after the devices have been manufactured but before the shipment of the devices to distributors and customers. The ever increasing demand in speed and performance of integrated circuits requires high speed input receivers to respond and communicate with an input signal with a pulse width of less than 2 nanoseconds. The fast 2 nanosecond response time in pulse width makes the input receivers susceptible to signal glitches.

Reliability screening of semiconductor devices typically occurs at manufacturing sites to ensure the proper operation of the device over the stated lifetime of the product. Common characteristics of burn-in tests place semiconductor devices in a high temperature and a high voltage environment at long timing cycles and long signal rise and fall times. The high voltages also cause high currents to be drawn from the devices. The burn-in boards are also designed to fit as many devices as possible. These factors can contribute to noise being injected on the signal lines. The adverse testing environment in which input receivers are placed under during the burn-in test, in combination with noise signals being injected around the receiver switch point, can cause an input receiver to switch multiple times within a cycle. Multiple numbers of signal switching can cause an input receiver to change several times and place the device into an unknown state.

FIG. 1 is a waveform diagram that shows an input signal that would likely to cause an input receiver to glitch during a transition. As shown in FIG. 1, the input signal changes from a low state, to a high state, back to a low state across the switching point. The switching, or trip, point represents the threshold in which an input signal is considered to be a logic high signal or a logic low signal. The input signal in this waveform diagram entered into three different states by crossing the switching point twice, from a low to a high and then from a high to a low and then back to a high. Such instability of the signal transition in input signals can place a device into an unknown state and render the burn-in test results invalid or can cause device damage due to the unknown device state.

Accordingly, it is desirable to have an input receiver that slows the response to the fluctuation of input signals to minimize signal glitches.

SUMMARY OF THE INVENTION

The present invention overcomes the foregoing limitations by disclosing an input receiver that slows its response to signal changes the amount of electrical currents flowing through the input receiver. The limiting of electrical current flowing through the input receiver slows the response of the receiver output which in effect filters out some level of glitches mixed with an input signal.

In one embodiment, the input receiver is constructed and implemented in a structure similar to a differential amplifier configuration for a single interface. In another embodiment, the input receiver is constructed and implemented in a modified differential amplifier configuration for a single interface. In a further embodiment, the input receiver is constructed and implemented in a modified differential amplifier configuration for multiple interfaces.

In the present invention, an input receiver in a burn-in mode, comprises: (1) a first transistor having a first terminal connected to a Vdd voltage, a second terminal, and a third terminal connected to the second terminal; (2) a second transistor having a first terminal connected to the Vdd voltage, a second terminal connected to the second and third terminals of the first transistor, and a third terminal; (3) a third transistor having a first terminal for connecting to the second and third terminals of the first transistor, a second terminal for receiving a reference_voltage signal, and a third terminal; (4) a fourth transistor having a first terminal connected to the third terminal of the second transistor, a second terminal for receiving an input signal, and a third terminal; (5) a fifth transistor having a first terminal connected to the third terminal of the third transistor and the third terminal of the fourth transistor, a second terminal for receiving an enable signal, and a third terminal connected to a Vss; and (6) a sixth transistor having a first terminal connected to the third terminal of the third transistor and the third terminal of the fourth transistor, a second terminal, and a third terminal connected to the Vss; (7) wherein during the burn-in mode, the fifth transistor being in an ON state and the sixth transistor being in an OFF state.

An advantage of the present invention is an increased noise immunity during a burn-in mode. The heightened noise immunity maintains an input receiver in a known state that would assert or de-assert input signal pins correctly. A second advantage of the present invention is that the amount of electrical current flowing through an input receiver during the burn-in mode is decreased. The lower amount of electrical current in an input receiver reduces the overall standby current which potentially allows a larger number of devices to be placed on a burn-in board. A third advantage of the present invention is that the input receiver has no residual effect of dynamic (AC) or static (DC) characteristics to the input receiver during normal operation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, therein.

DETAILED DESCRIPTION OF THE PREFERRED EMBODIMENTS

Figure 1:
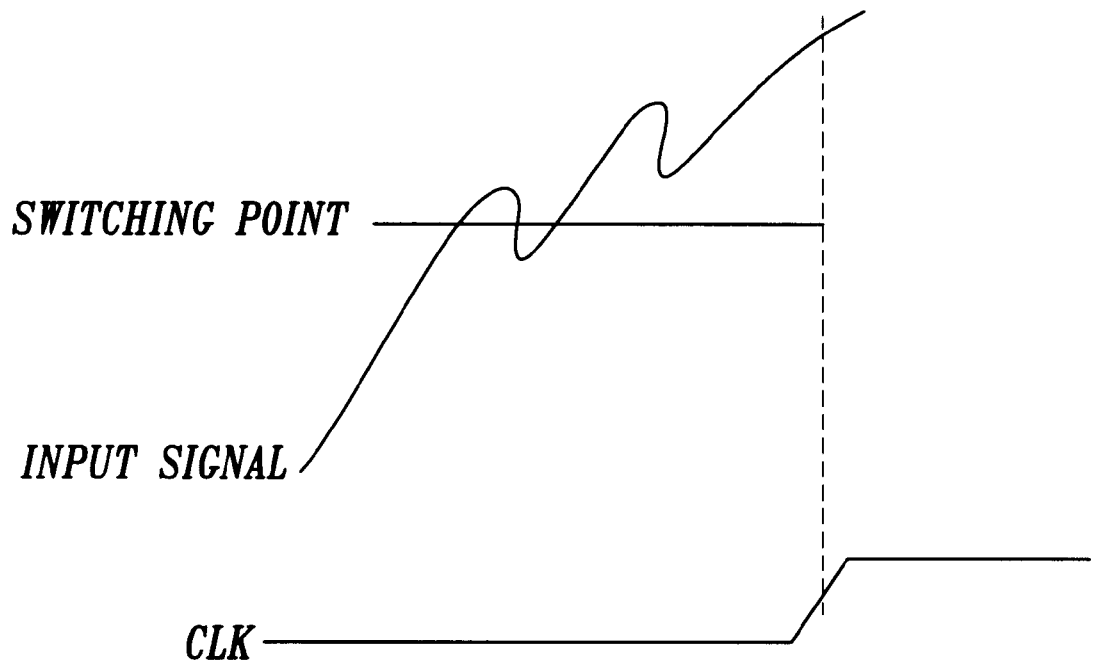
FIG. 1 is a waveform diagram that shows an input signal that would likely to cause an input receiver to glitch during a transition
Figure 2:
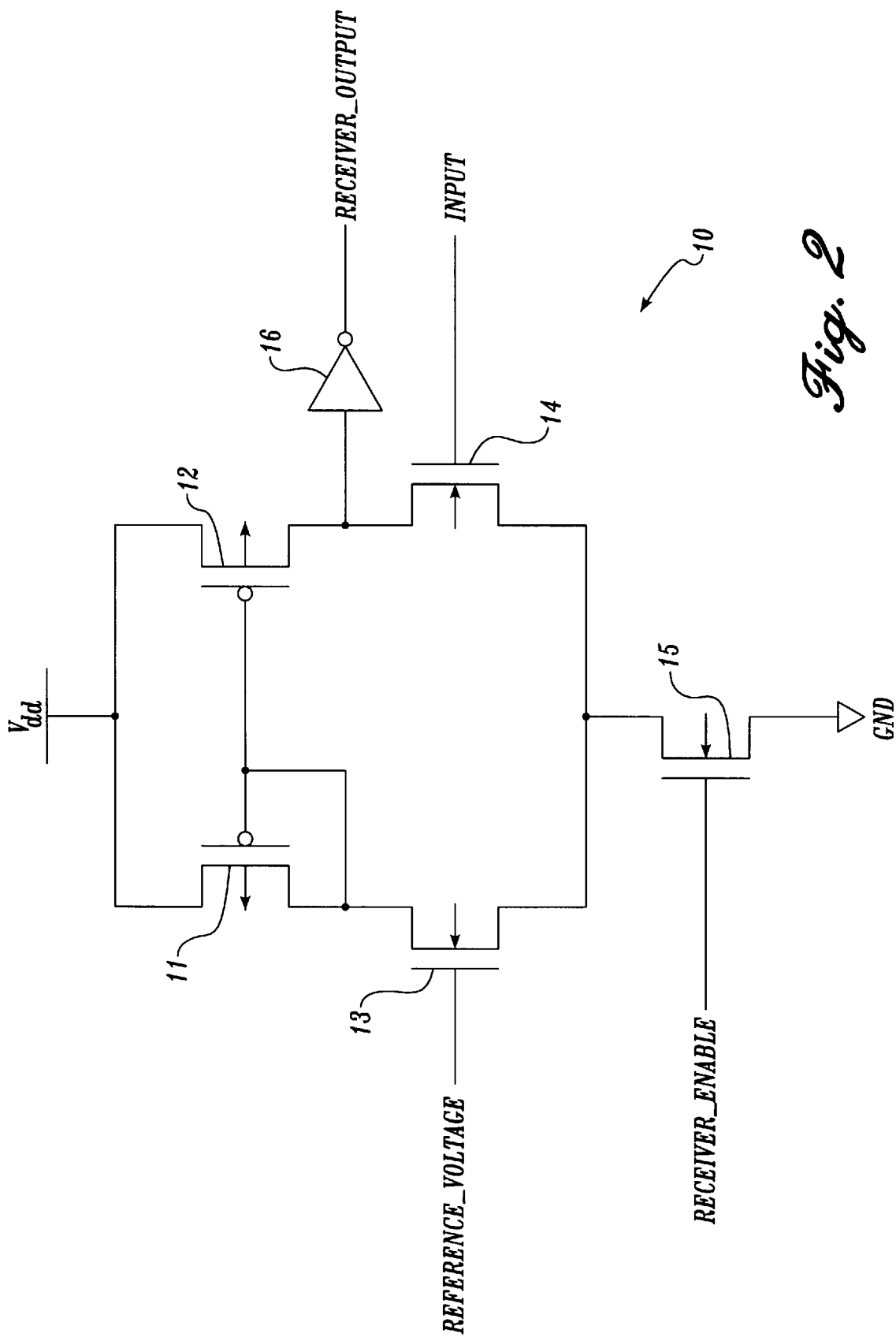
FIG. 2 is a schematic diagram of an input receiver in a differential amplifier configuration in the present invention.

FIG. 2 is a schematic diagram of an input receiver 10 in a differential amplifier configuration for a single interface in the present invention. The input receiver 10 includes P-channel field-effect transistors (PFET) 11 and 12, N-channel field-effect transistors (NFET) 13, 14, and 15, and an inverter 16. The PFET 11 has a source terminal connected to a Vdd, a gate terminal, and a drain terminal connected to the second terminal. The PFET 12 has a source terminal connected to the Vdd, a gate terminal connected to the gate and drain terminals of the PFET 11, and a drain terminal. The NFET 13 has a drain terminal connected to the gate and drain terminals of the PFET 11, a gate terminal for receiving a reference_voltage signal, and a source terminal. The NFET 14 has a drain terminal, a gate terminal for receiving an input signal, and a source terminal. The NFET 15 has a drain terminal connected to the source terminal of the NFET 13 and the source terminal of the NFET 14, a gate terminal for receiving a receiver_enable signal, and a source terminal connected to a Vss. The inverter 16 has an input connected to the drain terminal of the NFET 12 and the drain terminal of the NFET 14 and an output for generating a receiver output signal. The transistor sizes for PFETs 11 and 12 and NFETs 13–15 are selected as to produce the proper speed, power, and switching point for the input receiver but not to impact the input receiver's performance during normal operations.

All transistors, the PFETs 11–12, and the NFET 13–15 are always ON for the input receiver 10 to be in operation. The NFET 14 may be in an OFF state if the input signal is not enabled. An input signal of the input receiver 10 can be either a regular input signal or a clock signal in which the type of signal will impact the susceptibility of the input receiver 10. A regular input signal will be less susceptible to glitches because the input receiver 10 will have some margins in the set-up and hold time to accommodate the signal fluctuations. However, a clock signal is typically a periodic train of pulses that does not have set-up and hold time margins and will produce incorrect signals if the signal fluctuates during a latching edge of a clock signal.

For example, in synchronous dynamic random access memories, all signals are interpreted and latched at the rising edges of a clock signal. High temperatures, high voltages, and noises during the burn-in operations may cause a ringing effect during a signal transition. In one situation, where the input signal is a regular input signal like an address pin, the input signal of the input receiver 10 switches between logic ones and logic zeros. The input receiver 10 typically has a set-up time during the burn-in operation, and if the duration of the set-up time is sufficient to cover the ringing effect, then the input receiver 10 will still be operational since the input signal will eventually be settled to a logic "1" or a logic "0" state by the rising edge of the clock. Consequently, glitches that occur on a regular input signal will not have a significant impact on the overall operation of the input receiver 10. In a second situation, where the ringing effect occurs on a clock signal, the integrity in the operation of the input receiver 10 will be impacted because the input receiver 10 interprets or latches onto all the data on the rising edges of a clock signal. On a rising edge of a clock signal, the input receiver 10 may transfer a supposedly high signal but because of the signal fluctuation injected by the high temperature, high voltage, and/or noises, the input receiver may transfer multiple signals having a rising edge of an input signal. If the chip recognizes multiple transitions from the clock signal, the device can enter into an unknown state. This example illustrates latching onto a signal on a rising edge, but certainly the principles discussed here are equally applicable to other semiconductor devices that interpret data at a falling edge or some other edges of a signal.

Figure 3:
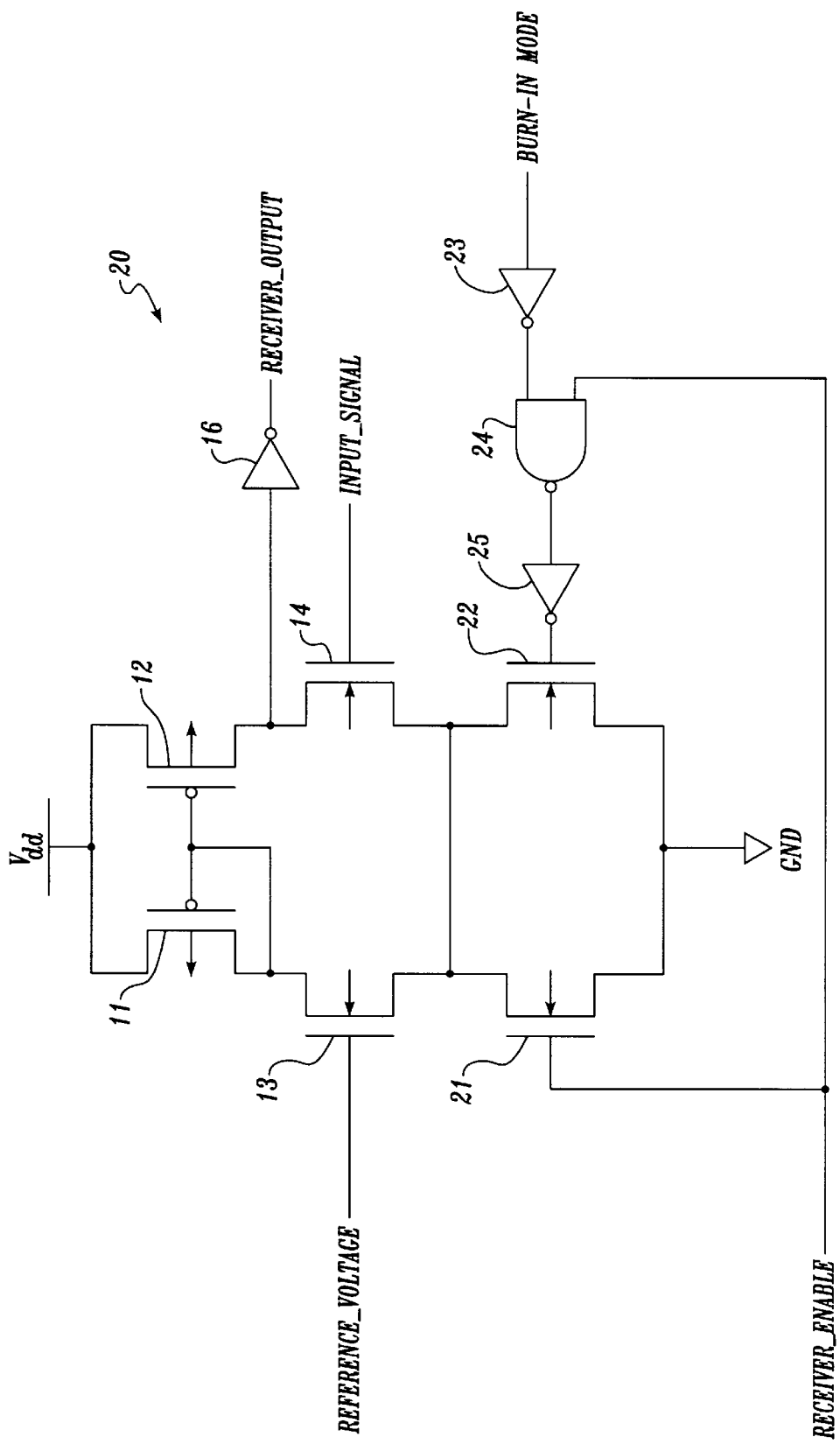
FIG. 3 is a schematic diagram of an input receiver in a modified differential amplifier configuration for a single interface.

FIG. 3 is a schematic diagram of an input receiver 20 in a modified differential amplifier configuration for a single interface. The input receiver 20 includes PFETs 11 and 12, NFETs 13 and 14, NFETs 21 and 22 which combine to represent the NFET 15, the inverter 16, an inverter 23, a NAND gate 24, and an inverter 25. The split of NFETs 21 and 22 from the NFET 15 provide increased current limiting capabilities in the input receiver 20. The PFETs 11 and 12, and the NFETs 13 and 14 are always ON during a burn-in operation or a normal mode operation. During the burn-in operation, one of the pull down transistors, the NFET 22, is turned OFF, while the other pull down transistor, the NFET 21, is turned ON. During the normal operation, the NFET 22 is also turned ON which sinks a large amount of electrical current through the second leg through the NFET 22 to a Vss.

In the burn-in operation, the burn-in mode signal is asserted high into an input of the inverter 23 which generates a low output signal. The low output signal from the inverter 23 is transmitted to the input of the NAND gate 24, which generates a high output signal. The high output signal from the NAND gate 24 is transmitted to an input of the inverter 25, which generates a low output signal. The low output signal from the inverter 25 turns OFF the NFET 22. During normal operations, the burn-in mode signal is asserted low to the input of the inverter 23, which generates a high-output signal. The high-output signal from the inverter 23 is transmitted to the NAND gate 24, which generates a low-output signal. The low-output signal from the NAND gate 24 is transmitted to the input of the inverter 25, which generates a high-output signal. The high-output signal from the inverter 25 turns ON the NFET 22 to sink a large amount of electrical current flowing through the input receiver 20.

Figure 4:
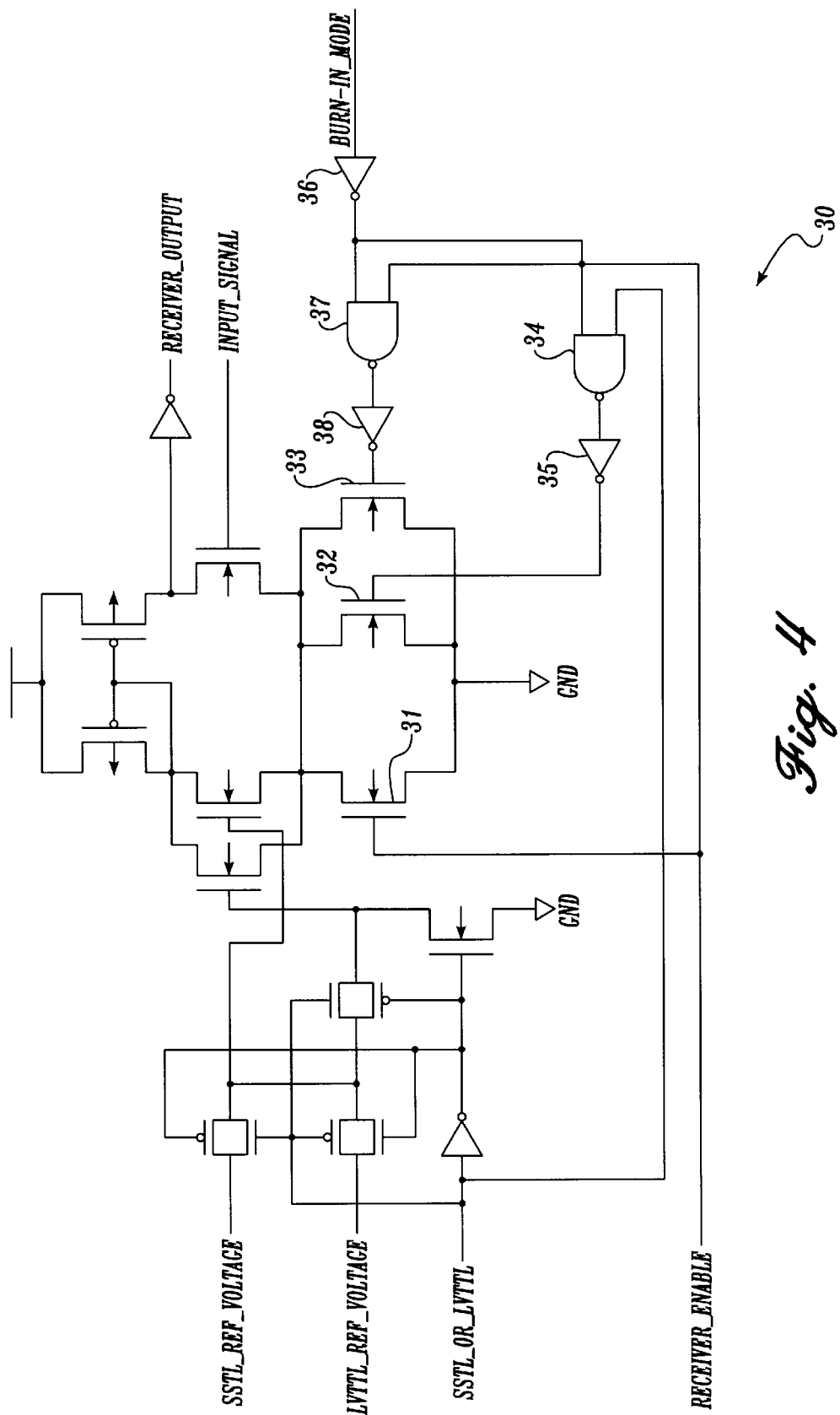
FIG. 4 is a schematic diagram of an input receiver in a modified differential amplifier configuration for multiple interfaces.

FIG. 4 is a schematic diagram of an input receiver in a modified differential amplifier configuration for multiple interfaces, including the transistor-transistor logic (TTL), low voltage TTL (LVTTL), and stub series terminated logic (SSTL). The TTL, LVTTL, and SSTL interfaces may have different high and low voltage requirements. LVTTL interfaces set an input high signal at 2.0 volts and an input low signal at 0.8 volt. SSTL interfaces require a high input signal at Vref+200 mv and a low-input signal at Vref−200 mv. TTL interfaces require a high signal level at 2.4 volts and a low signal level at 0.8 volt. The different types of interfaces requires the NFET 15 to be divided into three NFET transistors 31, 32, and 33 to accommodate and adjust the current requirements necessary for a particular type of interface. The TTL interface has a fixed high and low voltages such that the trip point does not depend on the Vdd voltage. Consequently, the input receiver 30 contains control signals for other interfaces including an LVTTL_ref_voltage signal, SSTL_ref_voltage signal, and a burn-in mode signal.

The three primary control signals, a burn-in mode signal, a receiver enable signal, and a SSTL_or_LVTTL signal, enables and disables the NFETs 31, 32, and 33 to represent the desirable type of interface or mode of operation. During a burn-in mode which operates irrespective of whether the input receiver 30 interfaces with a SSTL, LVTTL, or TTL interface, NFET 31 is turned ON while NFETs 32 and 33 are turned OFF. The receiver_enable signal is asserted high to turn ON NFET 31. The burn-in signal is asserted high into an input of the inverter 36, which generates a low output signal. The NAND gate 37 has a first input for receiving a low output signal from the inverter 36 and a second input for receiving a high signal from the receiver_enable signal, which generates a high output signal. The high output signal from the NAND gate 37 is transmitted to an input of the inverter 38, which generates a low output signal to turn OFF the NFET 33. The burn-in signal also generates, through the inverter 36, a low output signal to a second input of the NAND gate 34, which generates a high output signal. The high output signal from the NAND gate 34 is transmitted to an input of the inverter 35, which generates a low output signal to turn OFF the NFET 32.

During an SSTL normal operation, all three NFETs 31, 32 and 33 are turned ON. The receiver_enable signal is asserted high to turn ON the NFET 31. The receiver_enable signal is also asserted high to a first input of the NAND gate 34. The burn-in signal is asserted low to the input of the inverter 36, which generates a high output signal into a second input of the NAND gate 34. The SSTL_or_LVTTL signal is asserted high into a third input of the NAND gate 34. Since all three inputs of the NAND gate 34 are asserted high, the NAND gate 34 generates a low output signal to the input of the inverter 35. The low output signal transmitted to the input of the inverter 35 generates a high output signal from the inverter 35 to turn ON the NFET 32. The burn-in signal in the low state also propagates through the inverter 36 to generate a high output signal into the first input of the NAND gate 37. In addition to receiving the high output signal into the first input of the NAND gate 37, the NAND gate 37 also receives a high receiver_enable signal into the second input of the NAND gate 37, which generates a low output signal. The low output signal from the NAND gate 37 is transmitted to the input of the inverter 38, which generates a high output signal to turn ON the NFET 33.

During an LVTTL normal operation, NFETs 31 and 33 are turned ON while the NFET 32 is turned OFF. The receiver_enable signal is again asserted high to turn ON the NFET 31. The SSTL_or_LVTTL signal is asserted low into the second input of the NAND gate 34, which generates a high output signal. The high output signal from the NAND gate 34 is transmitted to the input of the inverter 35, which generates a low output signal to turn OFF the NFET 32. The NFET 33 is turned ON during an LVTTL normal operation in a fashion similar to that when the NFET 33 is turned ON during an SSTL normal operation.

An input receiver undergoes reliability screening tests in a burn-in mode irrespective to whether the interface is in an LVTTL or SSTL mode because the input receiver has a latitude of a few hundred millivolts in a burn-in mode and does not have to meet the specification requirement for a particular type of interface. A burn-in mode is typically a manufacturing operation only for reliability screening and such a mode is usually not available to customers and distributors. The transistor or transistors which are turned ON, the NFET 21, or NFETs 31 are selected as small of a size as possible while other transistors NFETs 22, 32, and 33 are turned OFF. The small device size of a transistor which was turned ON will severely limit the electrical current flowing through this device in making an input receiver respond much slower to a change in the input signal.

An optimal size of transistors in an input receiver depends on the type of process used. For example, the NFET 22 and NFET 21 have a ratio of 2-to- 1. Another way to size a transistor is by selecting the smallest width that the process will allow or whatever design rule was used. Considerations are taken into account in selecting an appropriate size for the NFET transistors. If a transistor is selected with a sufficiently large size, the device will not be sinking any additional electrical current. Conversely, if a device is made too small, the device will reach a point where it will not be able to sink enough current. In effect, the NFET 15 operates as a current limitor for the input receiver in a differential amplifier configuration. By splitting NFET 15 into multiple transistors, the amount of electrical current flowing through the input receiver can be controlled and adjusted by the split transistors. Lastly, the same reference_voltage signal may be used for burn-in operation as in normal operation, or the reference_voltage signal can be altered to a higher voltage level during burn-in operation to allow greater noise margin.

While the preferred embodiment of the invention has been illustrated and described, it will be appreciated that various changes can be made therein without departing from the spirit and scope of the invention. For example, the electrical current of the input receiver can also be limited by adjusting the receiver_enable signal on the NFET 15. Although the receiver_enable signal of the NFET 15 is typically set to a Vdd voltage, the voltage level of the receiver_enable signal can be adjusted to provide the same effect in limiting the electrical current flowing through the input receiver. By adjusting the voltage level of the receiver_enable signal, the voltage at the NFET 15 can be altered where one voltage level denotes a burn-in mode and another voltage level denotes a normal mode of operation.

The embodiments of the invention in which an exclusive property or privilege is claimed are defined as follows:

1. An input receiver that is selectively configured into a burn-in mode and a normal mode, the input receiver comprising:

a first transistor having a first terminal connected to a Vdd voltage source, a second terminal, and a third terminal connected to the second terminal;

a second transistor having a first terminal connected to the Vdd voltage source, a second terminal connected to the second and third terminals of the first transistor, and a third terminal;

a third transistor having a first terminal connected to the second and third terminals of the first transistor, a second terminal for receiving a reference_voltage signal, and a third terminal;

a fourth transistor having a first terminal connected to the third terminal of the second transistor, a second terminal for receiving an input signal, and a third terminal; and a fifth transistor having a first terminal connected to the third terminal of the third transistor and the third terminal of the fourth transistor, a second terminal for receiving a receiver_enable signal, and a third terminal connected to a Vss voltage source;

wherein the receiver_enable signal is adjusted to a first voltage level when the input receiver is enabled during the burn-in mode and to a second voltage level when the input receiver is enabled during the normal mode, the first voltage level being different from the second voltage level.

2. The input receiver of claim 1 wherein each of the first and second transistors is a P-channel field-effect transistor.

3. The input receiver of claim 1 wherein each of the third, fourth, and fifth transistors is an N-channel field-effect transistor.

4. The input receiver of claim 1 further comprising an inverter having an input lead connected to the third terminal of the second transistor and the first terminal of the fourth transistor, and an output end for providing an output signal.

5. An input receiver that is selectively configured into a burn-in mode and a normal mode, the input receiver comprising:

a first transistor having a first terminal connected to a Vdd voltage source, a second terminal, and a third terminal connected to the second terminal;

a second transistor having a first terminal connected to the Vdd voltage source, a second terminal connected to the second and third terminals of the first transistor, and a third terminal;

a third transistor having a first terminal connected to the second and third terminals of the first transistor, a second terminal for receiving a reference_voltage signal, and a third terminal;

a fourth transistor having a first terminal connected to the third terminal of the second transistor, a second terminal for receiving an input signal, and a third terminal;

a fifth transistor having a first terminal connected to the third terminal of the third transistor and the third terminal of the fourth transistor, a second terminal for receiving an enable signal, and a third terminal connected to a Vss voltage source; and a sixth transistor having a first terminal connected to the third terminal of the third transistor and the third terminal of the fourth transistor, a second terminal, and a third terminal connected to the Vss voltage source;

wherein during the burn-in mode, the sixth transistor is in an OFF state.

6. The input receiver of claim 5 wherein each of the first and second transistors is a P-channel field-effect transistor.

7. The input receiver of claim 5 wherein each of the third, fourth, fifth, and sixth transistors is a N-channel field-effect transistor.

8. The input receiver of claim 5 further comprising a first inverter having an input lead connected to the third terminal of the second transistor and the first terminal of the fourth transistor, and an output lead for providing an output signal.

9. The input receiver of claim 5 further comprising a second inverter having an input lead, and an output lead connected to the second terminal of the sixth transistor.

10. The input receiver of claim 9 further comprising a NAND gate having a first input lead, a second input lead for receiving the enable signal, and an output lead connected to the input lead of the second inverter.

11. The input receiver of claim 10 further comprising a third inverter having an input lead for receiving a burn-in signal and an output lead connected to the first input lead of the NAND gate.

12. An input receiver having multiple interfaces, comprising:

a first transistor having a first terminal connected to a Vdd voltage source, a second terminal, and a third terminal connected to the second terminal;

a second transistor having a first terminal connected to the Vdd voltage source, a second terminal connected to the second and third terminals of the first transistor, and a third terminal;

a third transistor having a first terminal connected to the second and third terminals of the first transistor, a second terminal for receiving a reference_voltage signal, and a third terminal;

a fourth transistor having a first terminal connected to the third terminal of the second transistor, a second terminal for receiving an input signal, and a third terminal;

a fifth transistor having a first terminal, a second terminal for receiving an enable signal, and a third terminal connected to a Vss voltage source;

a sixth transistor having a first terminal, a second terminal, and a third terminal connected to the Vss voltage source; and a seventh transistor having a first terminal connected to a common node, a second terminal, and a third terminal connected to the Vss voltage source, the common node being connected to the third terminal of the third transistor, the third terminal of the fourth transistor, the first terminal of the fifth transistor, the first terminal of the sixth transistor.

13. The input receiver of claim 12 wherein:

during a burn-in mode, the sixth and seventh transistors are in an OFF state.

14. The input receiver of claim 12 wherein:

during a first normal operation for an SSTL interface, the fifth, sixth, and seventh transistors are in an ON state.

15. The input receiver of claim 12 wherein:

during a second normal operation for an LVTTL interface, the fifth and seventh transistors are in an ON state, the sixth transistor is in an OFF state.

16. The input receiver of claim 12 wherein each of the first and second transistors is a P-channel field-effect transistor.

17. The input receiver of claim 12 wherein each of the third, fourth, fifth, sixth, and seventh transistor is a N-channel field-effect transistor.

18. The input receiver of claim 12 further comprising a first inverter having an input lead connected to the third terminal of the second transistor and the first terminal of the fourth transistor, and an output lead for providing an output signal.

19. The input receiver of claim 12 further comprising a second inverter having an input lead, and having an output lead connected to the second terminal of the seventh transistor.

20. The input receiver of claim 19 further comprising a first NAND gate having a first input lead, a second input lead for receiving the enable signal, and an output lead connected to the input lead of the second inverter.

21. The input receiver of claim 20 further comprising a third inverter having an input lead for receiving a burn-in signal and an output lead connected to the first input lead of the first NAND gate.

22. The input receiver of claim 12 further comprising a fourth inverter having an input lead, and an output lead connected to the second terminal of the sixth transistor.

23. The input receiver of claim 21 further comprising a second NAND gate having a first input lead for receiving the enable signal, a second input lead connected to the output lead of the third inverter, and a third input lead for receiving a select signal, the select signal selecting a type of the multiple interfaces.

24. The input receiver of claim 23 wherein the multiple interfaces comprise transistor-transistor logic, low voltage transistor-transistor logic, and stub series terminated logic interfaces.

* * * * *